United States Patent [19]

Okumura

[11] Patent Number: 4,914,056
[45] Date of Patent: Apr. 3, 1990

[54] METHOD OF MANUFACTURING A SEMICONDUCTOR DEVICE HAVING TAPERED PILLARS

[75] Inventor: Katsuya Okumura, Yokohama, Japan

[73] Assignee: Kabushiki Kaisha Toshiba, Kawasaki, Japan

[21] Appl. No.: 281,924

[22] Filed: Dec. 5, 1988

Related U.S. Application Data

[63] Continuation of Ser. No. 154,532, Feb. 5, 1988, abandoned, which is a continuation of Ser. No. 856,973, Apr. 29, 1986, abandoned.

[30] Foreign Application Priority Data

May 13, 1985 [JP] Japan .............................. 60-100916

[51] Int. Cl.$^4$ .......................................... H01L 21/283
[52] U.S. Cl. .................................... 437/192; 437/194; 437/246; 437/228
[58] Field of Search ............... 437/190, 192, 193, 200, 437/201, 194, 246, 228; 357/71; 156/643, 652, 656

[56] References Cited

U.S. PATENT DOCUMENTS

| | | | |
|---|---|---|---|
| 4,536,951 | 8/1985 | Rhodes et al. | 357/71 X |
| 4,614,021 | 9/1986 | Hulseweh | 357/71 X |
| 4,670,091 | 6/1987 | Thomas et al. | 156/653 |

OTHER PUBLICATIONS

Vossen et al., *Thin Film Processes*, Academic Press, 1980, pp. 39–41.
Oakley et al., *Proceeding of the 1984 IEEE VLSI Multilevel Interconnection Conference*, Jun. 21–22, 1984, pp. 23–29.

*Primary Examiner*—Brian E. Hearn
*Assistant Examiner*—T. N. Quach
*Attorney, Agent, or Firm*—Finnegan, Henderson, Farabow, Garrett and Dunner

[57] ABSTRACT

A method of manufacturing a semiconductor device having multi-layer structure with tapered pillars containing a refractory metal used for connecting interconnection layers. An aluminum containing layer is formed on the semiconductor substrate and a refractory metal (or silicide and nitride) containing layer is formed on the aluminum layer. These two layers are selectively and successively etched to form an interconnection layer having thereon a pattern formed of the refractory metal containing layer. The pattern is selectively etched to remove a portion of the pattern from the interconnection layer and leave a portion on the interconnection layer to thereby form pillars. The tapered portions are formed by isotropic etching.

8 Claims, 8 Drawing Sheets

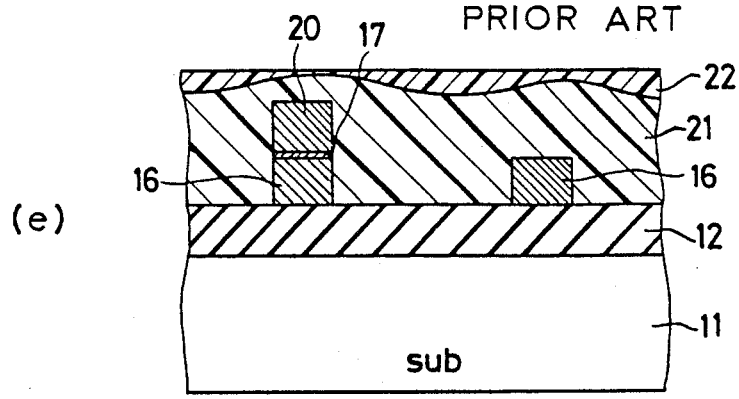
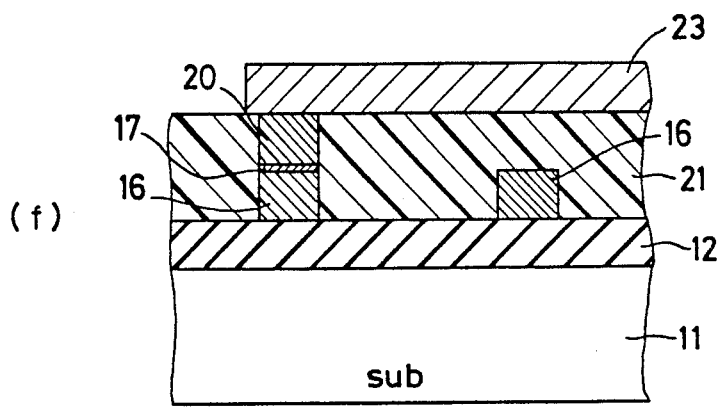
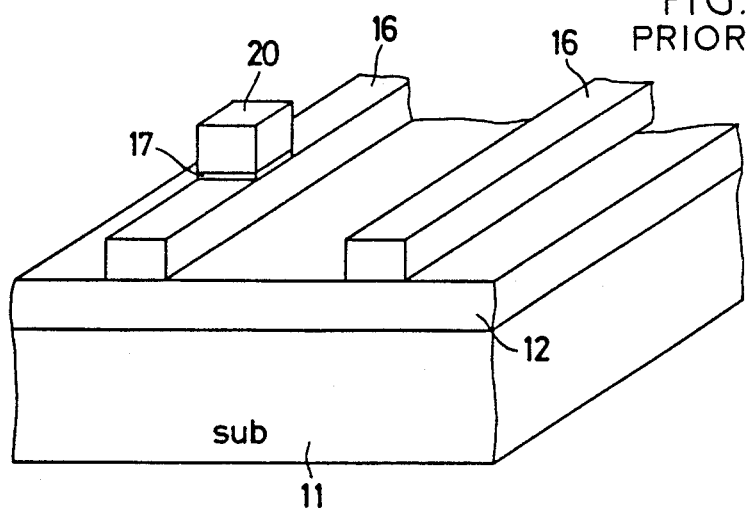

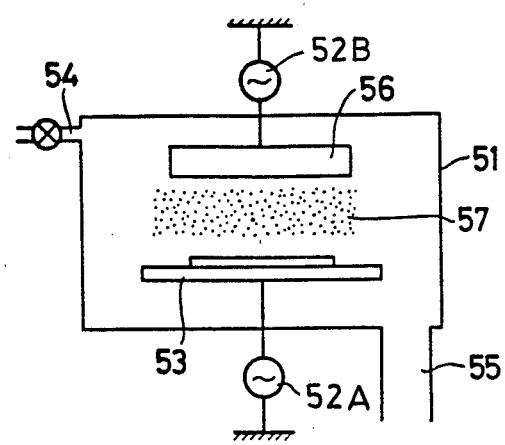
FIG. 7.
FIG. 8.
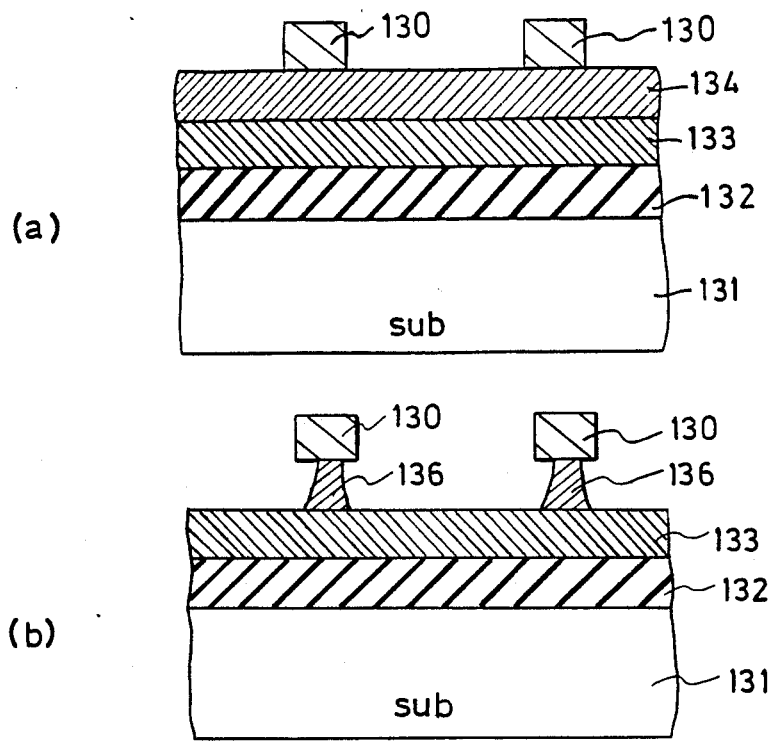

METHOD OF MANUFACTURING A SEMICONDUCTOR DEVICE HAVING TAPERED PILLARS

This application is a continuation of application Ser. No. 154,532, filed Feb. 5, 1988 now abandoned which is a continuation of Ser. No. 856,973, filed Apr. 29, 1986 now abandoned.

BACKGROUND OF THE INVENTION

1. Field of the Invention

This invention is concerned with a method of manufacturing a semiconductor device and in particular relates to a semiconductor device made using an improved multi-level interconnection layer forming step.

2. Description of the Prior Art

Conventionally the following method has been adopted for forming a multi-level interconnection layer on a semiconductor substrate. This method is explained with reference to FIG. 1 and FIG. 2. First of all, a field oxide film 2 is formed on the surface of a semiconductor substrate 1 to isolate island-shaped elements, and a first Al film is deposited on this oxide film 2. A first interconnection layer 3 is then formed by patterning this Al layer. After this, an insulating film 4 is deposited by the Chemical Vapor Deposition (CVD) Method to provide insulation between the first and second interconnection levels. Next, manufacture of the semiconductor device is completed by forming a second interconnection layer 6 connected through contact holes 5 with first interconnection layer 3 on insulating film 4 by sputtering a second Al film onto the entire surface and patterning.

However, with this conventional method as described above, device reliability is adversely affected by poor step coverage of the second Al film on the inside of contact holes 5. Furthermore, in order to prevent poor step coverage of contact holes 5, fringes 7 of second interconnection layer 6 have to be provided around contact holes 5. The interconnection density which can be attained is lowered by the need to form these fringes 7.

The above leads to the development of a multi-level interconnection technique wherein first and second interconnection levels are connected using pillars, as announced by R. E. Oakley et al, "IEEE, VLSI Multilevel Interconnection Conference, 1984". This technique will now be described, with reference to FIGS. 3(a) to (f) and FIG. 4.

A three-layer film is formed as shown in FIG. 3(a). First of all, a field oxide film 12 is formed to isolate island elements on the surface of a semiconductor substrate 11. Then an Al film 13 of thickness about 1 micron is deposited on oxide film 12 and constitutes a first interconnection layer. A Cr film 14 constituting an etch stop layer and an Al film 15 of thickness about 1 micron that is to constitute the pillars are successively deposited. After this, the three-layer film is patterned in the shape of the first interconnection layer, forming (nearest field oxide film 12), a first interconnection layer 16 consisting of Al, a Cr pattern 17, and an Al pattern 18 (see FIG. 3(b)).

Next, as shown in FIG. 3(c), a resist pattern 19 is formed by photolithography on those parts which are destined to become the pillars of Al pattern 18. After this, using resist pattern 19 as a mask, exposed Al pattern 18 and Cr pattern 17 are removed by etching. Resist pattern 19 itself is then removed, so that pillars 20 consisting of Al are formed on first interconnection layer 16 with Cr pattern 17 in between (see FIG. 3(d) and FIG. 4). FIG. 4 is a perspective view of FIG. 3(d). In this step, Cr pattern 17 and Al pattern 18 are removed from the other parts of first interconnection layer 16, which are adjacent the parts of first interconnection layer 2 where pillars 20 are formed.

Next, a liquid organic material such as polyimide is applied over the whole surface by spinning, to form an insulating film 21. The substrate surface is then planarized (see FIG. 3(e)) by applying a photoresist 22 on top of this insulating film 21. Following this, the tops of pillars 20 are exposed from photoresist film 22 and polyimide insulating film 21 by the etch-back technique. After this, a second interconnection layer 23 connected with first interconnection layer 16 by means of pillars 20 is formed (see FIG. 3(f)) by sputtering a second Al film onto the whole surface, and patterning.

The method of realizing multi-level interconnections using pillars 20 as described above enables higher circuit integration densities to be achieved than when multi-level interconnections are formed using contact holes, as hitherto. Such a method is, however, subject to the following problems.

(1) Since three metallic layers are involved, both film formation and etching are operationally inconvenient and the production steps are complicated.

(2) Fine patterning of the metal layers is difficult. Specifically, in order to etch the three-layer Al/Cr/Al construction, the reactive ion etching (RIE) technique is adopted, but the etching selectivity of the Al and photoresist cannot be made very high and is in fact usually about 2 to 3. As a result, patterning an Al film having a film thickness of approximately 2 micron using the photoresist pattern as a mask is difficult. Furthermore, when RIE of the Al is performed using a gas such as Cl system, after-corrosions tend to occur. This phenomenon is particularly marked with a three-layer structure as described above.

(3) Since an organic material such as a polyimide is used for the insulating film, water absorption by this organic material causes corrosion of the metal interconnections, resulting in polarization and causing deterioration of device characteristics or cracks, due to the large stresses. In particular, various reliability problems arise with MOS devices.

SUMMARY OF THE INVENTION

It is an object of the present invention to provide a method of manufacturing a semiconductor device whereby multi-level interconnections of high reiliability can be produced by simple steps.

This invention is a method of manufacturing a semiconductor device comprising the steps of: forming multi-layer structured layers consisting of a first layer including Al and a second layer including refractory metal on a semiconductor substrate; forming a first interconnection layer of required shape by patterning the first layer and forming a layer pattern on the first interconnection layer by patterning the second layer; forming pillars by selectively leaving behind the layer pattern in location such as to contact a second interconnection layer; forming an insulating layer including $SiO_2$; exposing the tops of the pillars from the insulating layer; and forming the second interconnection layer connected with the pillars.

By means of the method according to this invention, as stated above, a semiconductor device can be obtained wherein multi-level interconnections of high reliability are achieved by simple processes.

BRIEF DESCRIPTION OF THE DRAWINGS

FIG. 4 is a perspective view of FIG. 3(d).

FIG. 7 is a view of a magnetron type bias sputtering device used in this embodiment.

DESCRIPTION OF THE PREFERRED EMBODIMENTS

Figure 1:
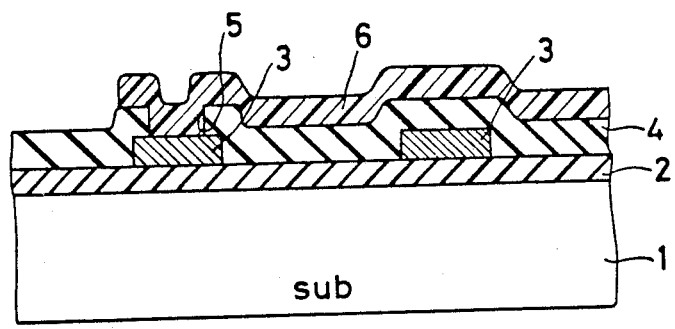
FIG. 1 is a cross-sectional view of a conventional semiconductor device having multi-level interconnections.
Figure 2:
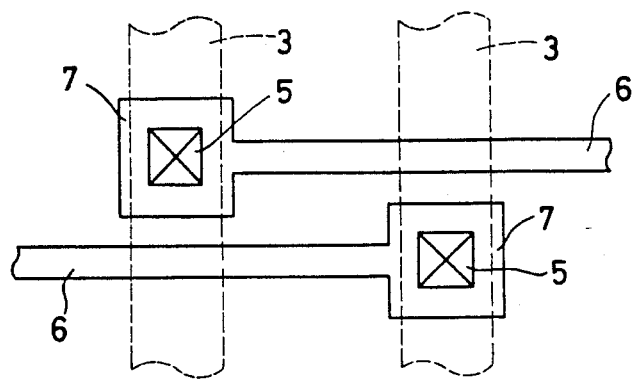
FIG. 2 is a plan view of FIG. 1.
Figure 3:
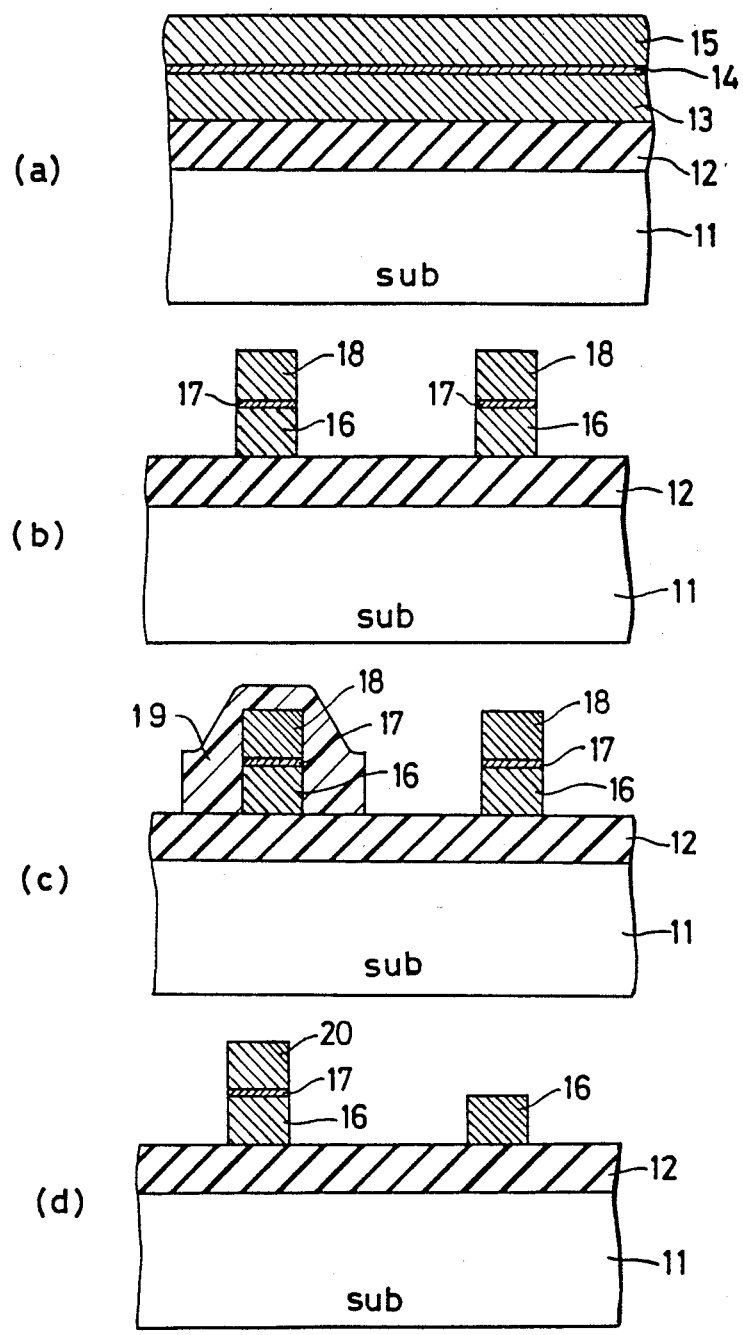
FIGS. 3(a) to (f) are cross-sectional views showing the steps involved in forming the multi-level interconnections of a semiconductor device according to another conventional method.

First embodiment of the invention is described below with reference to FIG. 5(a) to FIG. 5(f) and FIGS. 6 and 7.

First of all, a field oxide film 32 for isolation of island elements is formed on the surface of a silicon substrate 31. An approximately 0.8 micron to 1 micron thickness Al film 33 constituting a first interconnection layer and an approximately 1 micron thickness tungsten (W) film 34 destined to constitute the pillars are then successively deposited (see FIG. 5(a)) by the D.C. magnetron sputtering method onto oxide film 32. After this, a W pattern 36 and first interconnection layers 35 consisting of Al are formed (see FIG. 5(b)) from field oxide film 32 by selectively etching away these two films by the RIE technique, so as to form the shape of the first interconnection layer. Gas containing $CF_4$ of $SF_6$ gas is used to etch W film 34 and gas containing $Cl_2$ gas is used to etch Al film 33. The selectivity with respect to the photoresist in etching of W film 34 is 4.5 and the selectivity in etching of Al film 33 is more than 10. The selectivity with respect to a photoresist for etching of Al film 33 would be 2.8, which is low, but when the Al film 33 is etched, the tungsten film acts as the mask and with the W film 34 an etching selectivity of 15 or more is obtained. No problems therefore occur in etching Al film 33.

Figure 5:
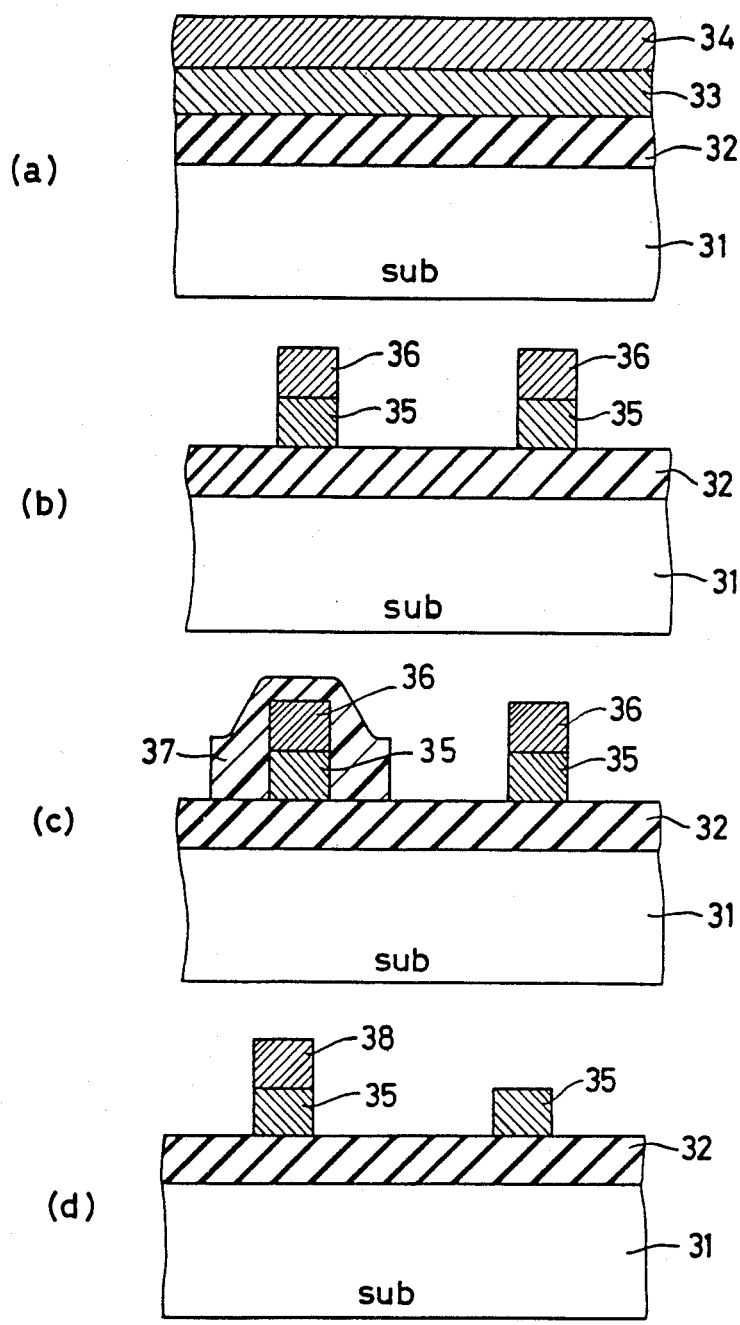
FIGS. 5(a) to 5(f) are cross-sectional views showing the formation steps of the multi-level interconnections of a semiconductor device according to an embodiment of this invention.
Figure 5:
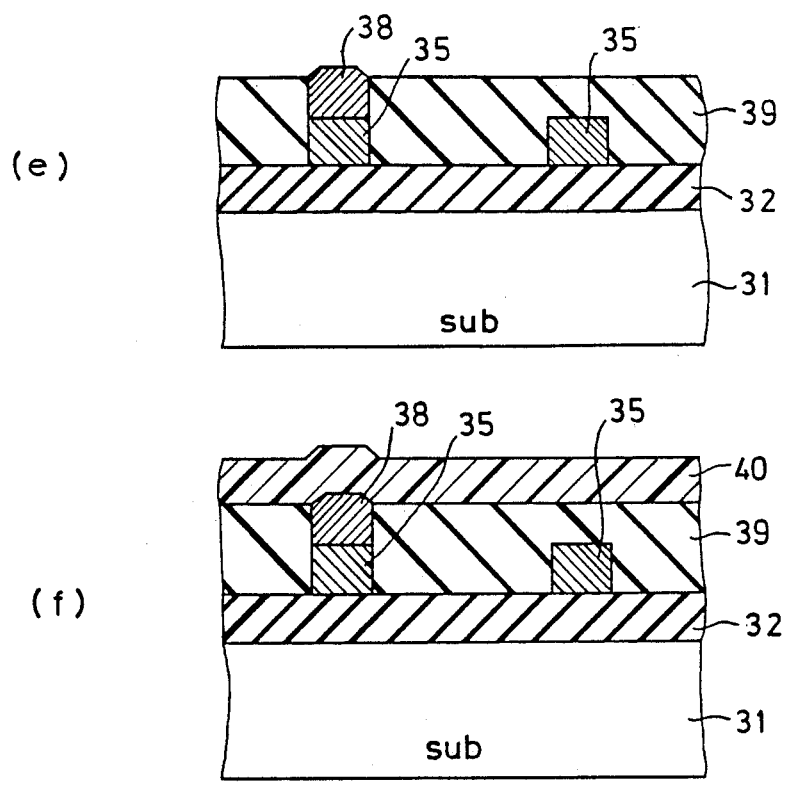
Figure 6:
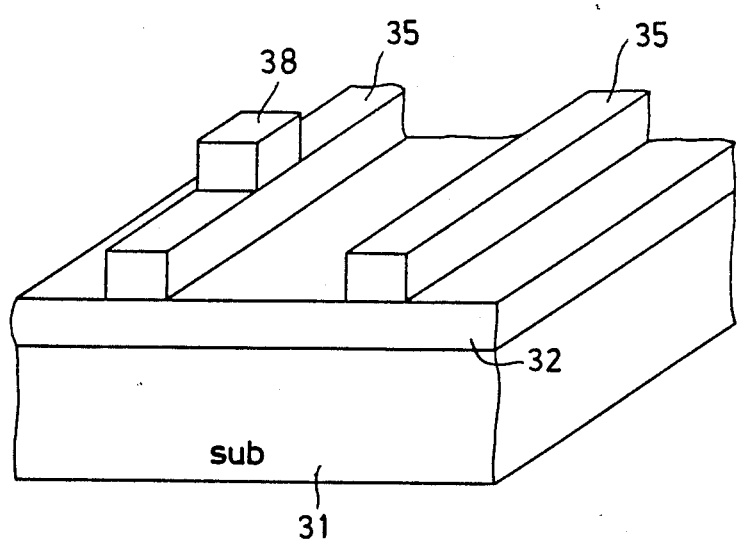
FIG. 6 is a perspective view of FIG. 5(d).

Next, photolithography is used to form a resist pattern 37 (see FIG. 5(c)) on those parts of W pattern 36 which are destined to form the pillars. After this, the exposed portions of W pattern 36 are selectively etched by RIE, using this resist pattern 37 as a mask. Resist pattern 37 is then removed so that pillars 38 consisting of W are left standing (see FIG. 5(d) and FIG. 6) on first interconnection layer 35. FIG. 6 is a perspective view of FIG. 5(d). In this step, the other parts of W pattern 36 on first interconnection layer 35, adjacent the parts of first interconnection layer 35 where pillars 38 are formed, are removed.

Next, substrate 31 formed with pillars 38 is placed on a support 53 connected to a first RF (Radio Frequency) power source 52A in a chamber 51 as shown in FIG. 7. After this, "bias sputtering" is performed by feeding in argon gas from gas inlet pipe 54 while this is exhausted from exhaust pipe 55 and applying 1 to 2 KW of electrical power to a quartz target 56 from a second RF power source while 10 to 20% of the electrical power of this second RF power source 52B is applied to support 53 from the first RF power source 52A, resulting in the formation of an argon plasma 57 between the substrate 31 and target 56 and deposition of an insulating film 39 including $SiO_2$. In this deposition process, depositing and sputtering on the substrate occurs at the same time, so an $SiO_2$ film of thickness about 1.8 micron is deposited while some thickness of $SiO_2$ film is left on the tops of W pillars 38. Thus, simply by this process, first interconnection layer 35 consisting of Al is buried and the edges of the tops of pillars 38 are formed with a taper by the sputtering referred to above. Subsequently, the $SiO_2$ film on the tops of pillars 38 is removed to expose the tops of pillars 38 from insulating film 39 (see FIG. 5(e)).

Next, the manufacture of the semiconductor device having multi-level interconnections is completed by sputtering a second Al film on over the entire surface and patterning to form a second interconnectin layer 40 connected with first interconnection layer 35 by means of pillars 38 (see FIG. 5(f)).

A second embodiment of this invention will now be described with reference to FIG. 8(a) to FIG. 8(g) and FIG. 9 and FIG. 10.

First of all, a field oxide film 132 for element isolation is formed on the surface of a silicon substrate 132. Then an approximately 0.8 micron to 1 micron thick Al film 133 constituting a first interconnection layer and a 1 micron thick refractory metal silicide (e.g. $MoSi_2$) film 134 that is to provide the pillars are successively formed (see FIG. 8(a)) on this oxide film 132 by D.C. magnetron sputtering. Following this, a resist 130 is formed in the shape of the first interconnection layer and the refractory metal silicide ($MoSi_2$) film 134 is etched using resist pattern 130 as a mask. In this etching process, a $MoSi_2$ pattern 136 is formed (see FIG. 8(b)) by etching away the $MoSi_2$ layer in the way of an isotropical etching with a tapered-shape by using a CDE (chemical dry etching) apparatus to carry out etching by a radical spcies such as fluorine with side etching. A plasma etching apparatus can also be used to etch with a taper by etching under conditions such that side etching takes place. After this etching of the $MoSi_2$ layer is performed, first interconnection layers 135 consisting of Al are formed (see FIG. 8(c)) by anisotropically etching away the first Al layer 133 using a plasma etching apparatus using the abovementioned resist as a mask.

Figure 10:
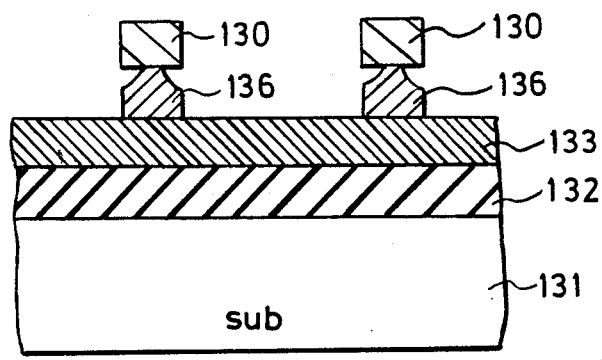
FIG. 10 is a cross-sectional view showing a single stage of the formation steps in a third embodiment of this invention.

As shown in FIG. 10, in the etching of the $MoSi_2$ film, part of this $MoSi_2$ film (for example, 50% of thickness) can be isotropically etched and then the rest can be anisotropically etched. Gas containing $CF_4$ gas or $SF_6$ gas is used to etch $MoSi_2$ film 134 and gas containing $Cl_2$ is used to etch Al film 133. The selectivity with respect to the photoresist in etching of $MoSi_2$ film 134 is 4 while the selectivity with respect to Al film 133 is at least 10. Though the selectivity with respect to the resist for etching of Al film 133 would be 2.8, which is low, actually when etching Al film 133 the mask is constituted by the MoSi$_2$ film, so an etching selectivity of at least 4 with respect to the resist is obtained. Thus no problems arise in etching.

Figure 8:
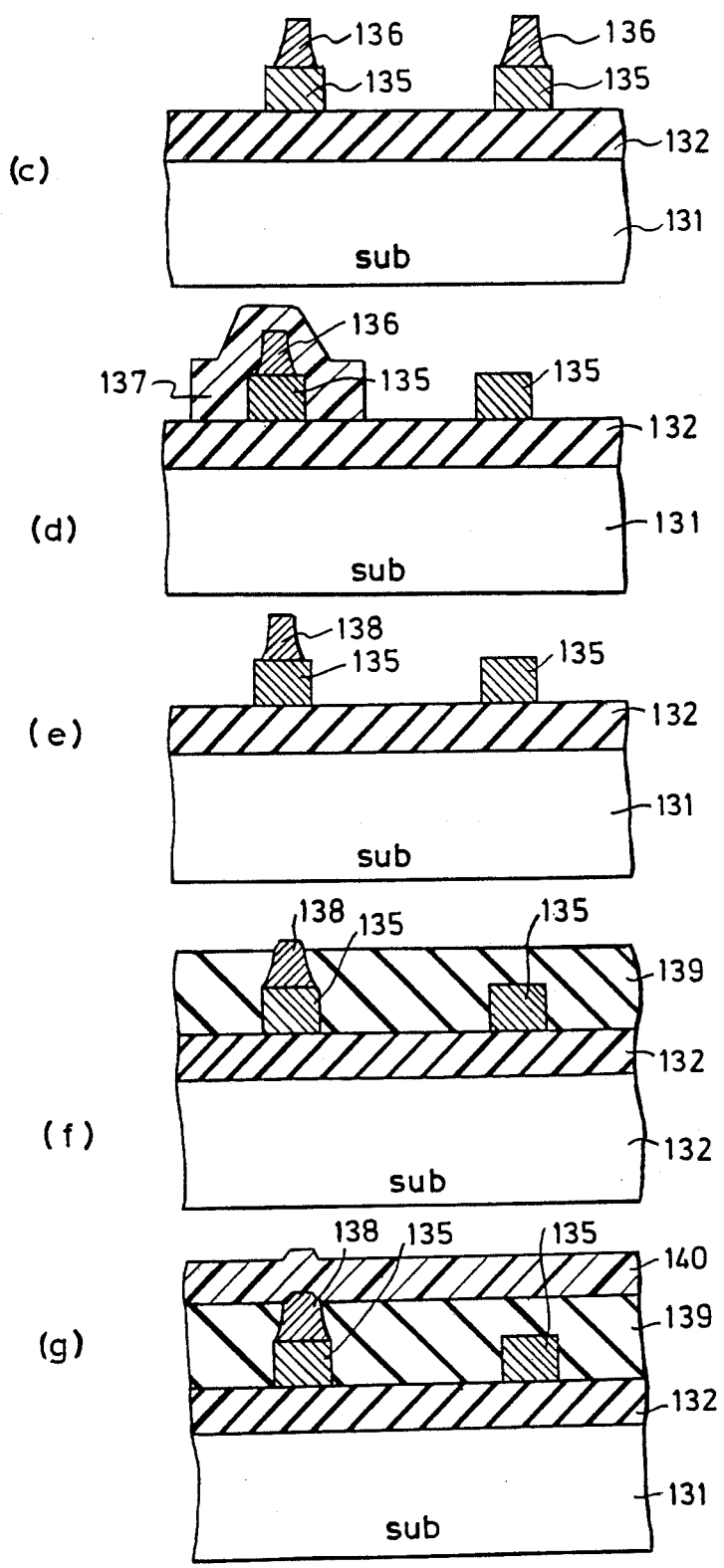
FIG. 8(a) to FIG. 8(g) are cross-sectional views showing the formation steps of multi-level interconnections of a semiconductor device according to a second embodiment of this invention.
Figure 9:
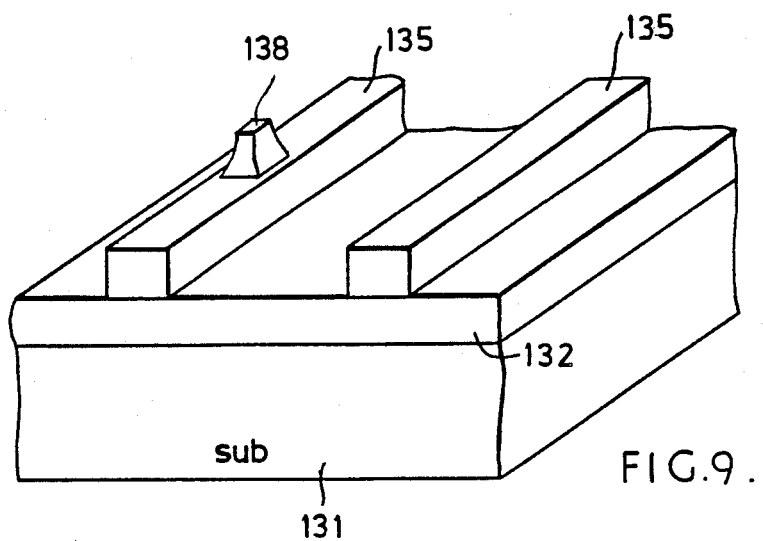
FIG. 9 is a perspective view of FIG. 8(e).

Next, the resist pattern 137 is formed (see FIG. 8(d)) by photolithography on the parts of MoSi$_2$ pattern 136 which are destined to form the pillars. After this, using resist pattern 137 as a mask, exposed MoSi$_2$ pattern 136 is selectively etched away by CDE, then pillars 138 consisting of MoSi$_2$ are formed (see FIG. 8(e) and FIG. 9), on first interconnection layer 135 by removing resist pattern 137. FIG. 9 is a perspective view of FIG. 8(e). In this step, those portions of MoSi$_2$ pattern 136 on first interconnection layer 135 that are adjacent those portions of first interconnection layer 135 where the pillars 138 are formed are removed.

Next, an insulating film 139 including of SiO$_2$ is deposited by placing substrate 131 formed with pillars 138 in chamber 51 shown in FIG. 7, as described in connection with the first embodiment, and producing an argon plasma 57 between substrate 131 and target 56 by bias sputtering. In this deposition step, sputtering takes place at the same time, so an SiO$_2$ film of thickness about 1.8 micron is deposited and simply by leaving some thickness of SiO$_2$ film on the tops of MoSi$_2$ pillars 138, first Al interconnection layer 135 is buried, and the edges of the tops of pillars 138 are formed with a taper by the abovedescribed sputtering etching. After this, the tops of pillars 138 are exposed from insulating film 139 (see FIG. 8(f)) by removing the SiO$_2$ film at the tops of pillars 138.

Next, manufacture of a semiconductor device with multi-level interconenctions is completed by sputtering a second Al film over the entire surface and patterning to form a second interconnection layer 140 connected with first interconnection layer 135 through the aforementioned pillars 138 (see FIG. 8(g)).

Thus, since according to this invention first interconnection layers 35 and 135 and pillars 38 and 138 are formed by two layers of Al and W film or Al and MoSi$_2$, the manufacturing steps are very much shortened as compared with the prior art method, in which such first interconnection layers and pillars are formed from a three-layer film of Al/Cr/Al.

As mentioned above, in the first embodiment, in etching the upper layer, constituted by W film 34, and the lower layer, constituted by Al film 33, by RIE using a photoresist pattern as a mask, the etching selectivity of the photoresist and W is large, namely 10 or more. And in etching the lower Al film 33, it is the W pattern 36 (which has an etching selectivity of 15 with respsect to the Al) that is the mask. This makes it possible to achieve fine patterning of this Al film 33, while yet letting it have an appreciable thickness. This in turn enables formation of first interconnection layer 35 with interconnections of the required narrow width. Furthermore, since pillars 38 are composed of W, there is no need for a second etching with Cl$_2$ as in the conventional case, in which both the first interconnection layer and the pillars are composed of Al. This diminishes the occurrence of after-corrosions of this Cl$_2$ with first interconnection Al layer 35.

Moreover, the formation according to this invention of insulating films 39, 139 between first and second interconnection layers 35, 135 and 40, 140 by bias sputtering enables device deterioration and formation of interconnection layer cracks, which occur with the conventional method, in which the insulating film is formed of an organic material such as polyimide, which tends to be water-absorbent, to be prevented.

Additionally, since formation of the insulating film 39 is carried out by bias sputtering, the insulating film (in this case SiO$_2$ film) that is deposited on the tops of pillars 38, 138 can be made extremely thin. Thus this SiO$_2$ film can be removed by lightly etching after bias sputtering, to expose the tops of these pillars 38, 138 from insulating film 39, 139. Additionally, in such bias sputtering, the tops of pillars 38, 138 consisting of W or MoSi$_2$ become tapered as shown in FIG. 5(e) and FIG. 8(f), so occurrence of sharp level steps in second interconnection layers 40, 140 where they cross pillars 38, 138 can be prevented and the area of surface contact with second interconnection layers 40 and 140 can be increased. Thus a fully satisfactory connection can be achieved between first and second interconnection layer 35, 135 and 40, 140 even though the area of these pillars 38, 138 is small.

In the case of the second embodiment, the occurrence of voids or imperfections which happened conventionally in the insulating film in the burial process can be reduced, because the pillars themselves are formed with a taper. This is effective in semiconductor devices having a high degree of circuit integration with interconnection gaps of 1 micron or less.

Although in the above embodiments the insulating film is formed by bias sputtering, the invention is not restricted to this. To avoid damaging the tops of the pillars and the surface of the first interconnection layer by bias sputtering, it is possible to first form a SiO$_2$ layer of thickness 1000 to 1500 Angstrom units by LPCVD or sputter deposition, then form the rest of the SiO$_2$ by bias sputtering.

Furthermore, although in the above embodiments the first and second interconnection layers are formed of Al, the invention is not restricted to this either. For example, the first and second interconnection layers can be formed of an Al alloy such as Al-Si or Al-Cu-Si.

In the above embodiments, W and MoSi$_2$ are used as the metals forming the pillars. However, the invention is not restricted to this. For example, apart from W and MoSi$_2$, refractory metals such as Mo, Ti (titanium), Ta, Pt, or Hf (hafnium), refractory metal silicides such as tungsten silicide WSi, molybdenum silicide MoSi$_2$, titanium silicide TiSi$_2$, tantalum silicide, platinum silicide, or hafnium silicide, or refractory metal nitrides of high electrical conductivity such as titanium nitride or tantalum nitride, or refractory metal carbides such as TiC, WC or SiC or refractory metal borides such as TiB$_2$ or LaB$_6$ can be used. Of the refractory metals referred to above, those of Ti and Hf are preferred because of their good electrical conductivity.

The thickness of all of the coatings referred to above from which the pillars are formed is preferably at least 0.5 micron. This is because, in order to reduce the stray capacitance between these interconnection layers, the thickness of the insulating film that insulates the first interconnection layer from the second interconnection layer is preferably at least 0.5 micron, so the thickness of the coating that is to constitute the pillars, corresponding to the thickness between the interconnection layers, should also preferably be at least 0.5 micron.

As described in detail above, according to this invention, a first interconnection layer and second interconnection layer of close track spacing can be connected together by means of pillars of small width by simple steps and a SiO$_2$ film can be used for the insulating film.

This makes possible a method of mass-producing semiconductor devices with a high density of circuit integration having multi-level interconnections of high reliability, without the complexity and problems that arise in RIE and in film formation, which cause difficulties in the conventional method.

What is claimed is:

1. Method of manufacturing a semiconductor device comprising the steps of:
    forming on a semiconductor substrate multi-layer structured layer consisting of a first Al or Al alloy layer and a second refractory metal or refractory metal silicide layer formed on said first layer;
    selectively forming a resist layer on said layers;
    isotropically etching said second layer to form a pattern having a tapered portion from said second layer using said resist layer as a mask;
    anisotropically etching said first layer to form from said first layer a first interconnection layer using said resist layer as a mask;
    selectively etching said pattern to remove a portion of said pattern from said first interconnection layer and leave a portion of said pattern on said first interconnection layer to form pillars thereon;
    forming an insulating layer including $SiO_2$ on said substrate;
    exposing top and edge surfaces of said pillars from said insulating layer; and
    forming a second interconnection layer connected with said top and edge surfaces of said pillars.

2. Method according to claim 1 wherein said first layer is etched using said second layer as a mask.

3. Method according to claim 1, wherein said pillars are formed with a taper.

4. Method according to claim 1, wherein said first layer is selected from the group consisting of Al, Al-Si, Al-Cu-Si, and an Al alloy including Ti.

5. Method according to claim 1 wherein said second layer is selected from the group consisting of a refractory metal, a refractory metal silicide, and refractory metal nitride.

6. Method according to claim 1 wherein said insulating layer is formed by a method including bias sputtering.

7. Method according to claim 1 wherein said insulating layer is formed by a bias sputtering method after first forming using a deposition method.

8. Method according to claim 1 wherein said second layer is isotropically etched a portion of its thickness and anisotropically etched the remainder of its thickness.

* * * * *